United States Patent
Loubet et al.

(10) Patent No.: US 7,776,679 B2
(45) Date of Patent: Aug. 17, 2010

(54) METHOD FOR FORMING SILICON WELLS OF DIFFERENT CRYSTALLOGRAPHIC ORIENTATIONS

(75) Inventors: Nicolas Loubet, Grenoble (FR); Didier Dutartre, Meylan (FR); Frederic Boeuf, Le Versoud (FR)

(73) Assignees: STMicroelectronics Crolles 2 SAS, Crolles (FR); STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/175,877

(22) Filed: Jul. 18, 2008

(65) Prior Publication Data

US 2009/0023275 A1 Jan. 22, 2009

(30) Foreign Application Priority Data

Jul. 20, 2007 (FR) .................... 07 56652

(51) Int. Cl.
*H01L 21/8238* (2006.01)
(52) U.S. Cl. .............. 438/222; 438/429; 438/478; 257/E21.09
(58) Field of Classification Search ........ 438/198, 438/222, 223, 429, 478; 257/371, E21.09, 257/E21.103
See application file for complete search history.

(56) References Cited

U.S. PATENT DOCUMENTS

| | | | | |
|---|---|---|---|---|
| 6,972,478 B1 * | 12/2005 | Waite et al. | ........... | 257/627 |
| 7,544,548 B2 * | 6/2009 | Sadaka et al. | ........... | 438/154 |
| 2005/0079691 A1 * | 4/2005 | Kim et al. | ........... | 438/481 |
| 2005/0280121 A1 | 12/2005 | Doris et al. | | |
| 2006/0017137 A1 | 1/2006 | Iwamatsu | | |
| 2006/0113629 A1 | 6/2006 | Wei et al. | | |
| 2006/0115933 A1 * | 6/2006 | Ye et al. | ........... | 438/139 |
| 2007/0218654 A1 | 9/2007 | Spencer et al. | | |
| 2007/0259112 A1 * | 11/2007 | Ishikawa et al. | ........... | 427/248.1 |

OTHER PUBLICATIONS

Bogumilowicz, Y., et al., "Chemical Vapour etching of Si, SiGe and Ge with HCl", Semicond.Sci.Technol. 20 (2005), 127-134.*
Isheden, C. et al. "Formation of Shallow Junctions by HCl-Based Si Etch Followed by Selective Epitaxy of B-Doped $Si_{1-x}Ge_x$ in RPCVD." *Journal of Te Electrochemical Society*, vol. 151, No. 6, pp. C365-C368; 2004.
Yang, M. et al. "Hybrid-Orientation Technology (HOT): Opportunities and Challenges." *IEEE Transactions on Electron Devices*, vol. 53, No. 5, pp. 965-978; 2006.
French Search Report dated Mar. 18, 2008 from French Patent Application No. 07/56652.

* cited by examiner

*Primary Examiner*—Tuan N. Quach
(74) *Attorney, Agent, or Firm*—Lisa K. Jorgenson; James H. Morris; Wolf, Greenfield & Sacks, P.C.

(57) ABSTRACT

A method for manufacturing silicon wells of various crystallographic orientations in a silicon support, including the steps of: forming a silicon layer having a first orientation on a silicon substrate having a second orientation; forming insulating walls, defining wells extend at least down to the border between the silicon substrate and the silicon layer; performing, in first wells, a chemical vapor etch (CVE) of the silicon layer by means of hydrochloric acid, in an epitaxy reactor, at a temperature ranging between 700° C. and 950° C.; and performing, in the first wells, a vapor-phase epitaxy on the silicon substrate in the presence of a precursor of silicon and hydrochloric acid, at a temperature ranging between 700° C. and 900° C. and up to the upper surface of the silicon layer.

18 Claims, 1 Drawing Sheet

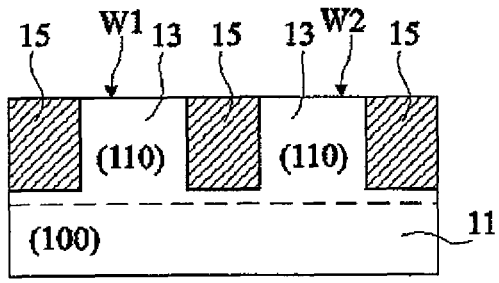
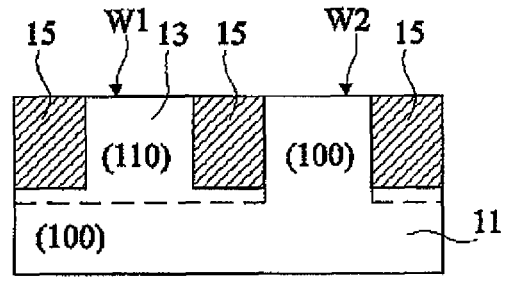
Fig 1A (Prior Art)    Fig 1B (Prior Art)
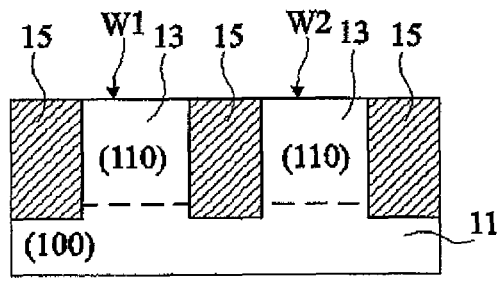
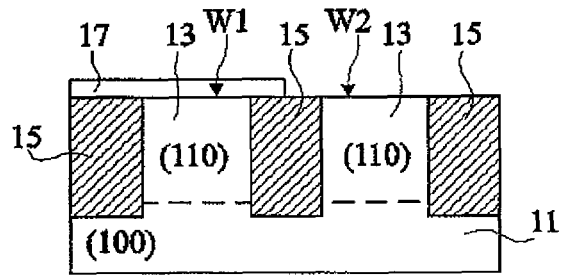
Fig 2A    Fig 2B
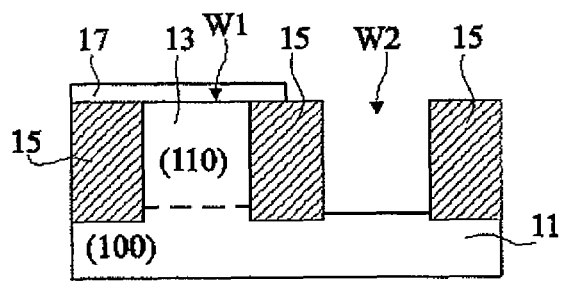
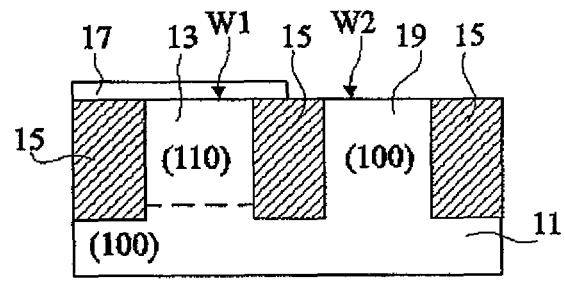
Fig 2C    Fig 2D
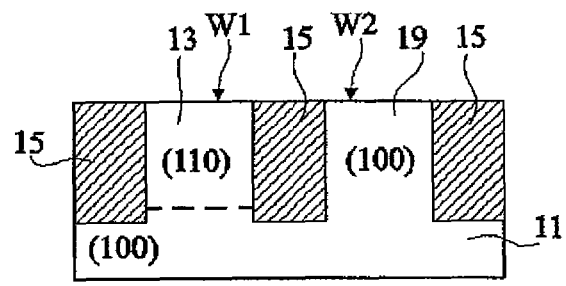
Fig 2E

METHOD FOR FORMING SILICON WELLS OF DIFFERENT CRYSTALLOGRAPHIC ORIENTATIONS

BACKGROUND OF THE INVENTION

1. Field of the Invention

The present invention relates to semiconductor supports and, more specifically, to a silicon support having its surface comprising wells having different crystallographic orientations.

2. Discussion of the Related Art

In integrated circuit manufacturing, it is typical to form, on the same silicon substrate, both N-channel metal-oxide-semiconductor transistors (MOS) and P-channel MOS transistors. It is known that faster P-channel MOS transistors are obtained in silicon of crystallographic structure (110) and faster N-channel MOS transistors are obtained in silicon of crystallographic structure (100).

Methods enabling to form, in the same silicon substrate, wells having one or the other of the above-mentioned orientations have thus been searched for.

FIG. 1A is a cross-section view of an initial structure for various methods used in the forming of wells of different orientations. A silicon layer 13 of crystallographic orientation (110) extends on a silicon substrate 11 of crystallographic orientation (100). Insulating walls 15 are formed in silicon layer 13 and delimit silicon wells W1 and W2. As an example, insulating walls 15 may be made of silicon oxide. FIG. 1B illustrates the result obtained by various known methods for forming wells of different orientations. In this drawing, silicon wells W1 have kept an orientation (110) and silicon wells W2 have been transformed and have an orientation (100).

A first method which can be envisaged to pass from the structure of FIG. 1A to the structure of FIG. 1B comprises etching upper silicon layer 13 in wells W2, then performing, in the openings thus formed, an epitaxy from substrate 11 of orientation (100). However, it is generally considered that current etch and epitaxy techniques do not enable forming, in wells W2, single-crystal silicon having an even upper surface. It is then necessary to perform an additional step to polish the upper silicon surface, for example, a chem./mech. polishing (CMP). However, CMP techniques induce surface defects which prevent the forming of quality MOS transistors. Such disadvantages of epitaxy techniques are especially discussed in U.S. Pat. No. 7,060,585 in relation with FIGS. 5G to 5I.

Various complex methods have then been provided. However, U.S. Pat. No. 7,060,585 describes a method for forming wells of different orientations which includes forming an amorphization implantation in wells W2, then performing an anneal at high temperature. This anneal enables extending crystallographic structure (100) of silicon substrate 11 into the amorphized areas. The structure of FIG. 1B is thus obtained. This method especially has two disadvantages. First, the amorphization step creates defects in the silicon wells W2, which are not totally eliminated during the anneal. To attenuate these defects, more or less effective additional processings must be carried out. Further, this method requires an anneal step at a very high temperature, on the order of 1200° C., which is particularly difficult to implement.

SUMMARY OF THE INVENTION

There is need for a simple method for manufacturing a support comprising wells having different crystallographic orientations while avoiding the problems of known methods.

Thus, an embodiment of the present invention provides a method for manufacturing silicon wells of various crystallographic orientations in a silicon support, comprising the steps of:

forming a silicon layer having a first orientation on a silicon substrate having a second orientation;

forming insulating walls which extend at least down to the border between the silicon substrate and the silicon layer, these walls defining wells;

performing, in first wells, a chemical vapor etch (CVE) of the silicon layer by means of hydrochloric acid, in an epitaxy reactor, at a temperature ranging between 700° C. and 950° C.; and performing, in the first wells, a vapor-phase epitaxy on the silicon substrate in the presence of a precursor of silicon and hydrochloric acid, at a temperature ranging between 700° C. and 900° C. and up to the upper surface of the silicon layer, this epitaxy being performed in said epitaxy reactor.

According to an embodiment of the present invention, the etch and epitaxy steps are carried out at a pressure ranging between 600 Pa and 11,000 Pa.

According to an embodiment of the present invention, the first orientation is orientation (110) and the second orientation is orientation (100).

According to an embodiment of the present invention, the silicon precursor belongs to the group comprising trichlorosilane ($SiHCl_3$), dichlorosilane ($SiH_2Cl_2$), and silicon hydrides.

The foregoing objects, features, and advantages of the present invention will be discussed in detail in the following non-limiting description of specific embodiments in connection with the accompanying drawings.

BRIEF DESCRIPTION OF THE DRAWINGS

FIG. 1A is a cross-section view of a silicon support comprising wells having the same orientations;

FIG. 1B is a cross-section view of a silicon support comprising wells having the different orientations; and FIGS. 2A to 2E are cross-section views illustrating results of steps of a method according to an embodiment of the present invention.

DETAILED DESCRIPTION

For clarity, the same elements have been designated with the same reference numerals in the different drawings and, further, as usual in the representation of semiconductor structures, the various drawings are not to scale.

FIGS. 2A to 2E illustrate results of steps of a method enabling forming wells of different crystallographic structures on a same substrate according to an embodiment of the present invention. In all these drawings, only two laterally-insulated silicon wells have been shown, but it should be understood that the present invention applies to the forming of a significant number of silicon wells.

FIG. 2A is a cross-section view of the initial structure of the method according to an embodiment of the present invention. A semiconductor substrate 11 having a crystallographic orientation (100) supports a silicon layer 13 having an orientation (110). As an example, silicon layer 13 may have a thickness ranging between 120 and 400 nm. Insulating walls 15 cross silicon layers 13 and slightly penetrate into silicon substrate 11 to delimit silicon wells W1 and W2. As an example, insulating walls 15 may be formed by the succession of the following steps:

forming openings in silicon layer 13 and in an upper portion of silicon substrate 11;

growing or depositing a thin layer of a thermal oxide on the pattern formed by the openings in silicon layer 13 and in the upper portion of substrate 11;

depositing an oxide on the thin thermal oxide layer to fill the openings (as an example, this oxide may be deposited from tetraethoxysilane $Si(OC_2H_5)_4$, also called TEOS);

chem./mech. polishing to remove the oxide located outside of the openings; and annealing the structure, thus enabling densifying the oxide to improve its quality.

This method for forming insulating walls 15 enables obtaining walls having substantially vertical sides (preferably slightly flared), which are very planar, very even and defect-free. This type of insulation is called shallow-trench insulation in the art (STI).

At the step illustrated in FIG. 2B, a mask 17 has been formed above the wells W1 which are desired to keep an orientation (110). Generally, mask 17 deposited at this step covers all the areas which are desired to keep an orientation (110). Mask 17 is either made of a material selectively etchable with respect to the material of insulating walls 15 and to silicon, for example, of silicon nitride, or very thin as compared with the height of insulating walls 15, for example, an oxide from one to a few nanometers.

At the step illustrated in FIG. 2C, the silicon of layer 13 located in wells W2 unprotected by mask 17 has been etched. This operation is performed so that the silicon of layer 13 is etched at least down to the border with silicon substrate 11. The used etching is a chemical vapor etching (CVE) which is performed by means of hydrochloric acid HCl, hydrogen being used as a carrier gas, at a low temperature, ranging between 700° C. and 900° C., and at a high pressure, ranging between 600 Pa and 11,000 Pa. This type of etching enables avoiding etching of the sides of insulating walls 15 since HCl has a nearly infinite selectivity over these insulating walls. This enables keeping the planar character of the sides of the insulating walls on either side of wells W2. The etching is performed in an epitaxy reactor.

At the step illustrated in FIG. 2D, an epitaxial growth of silicon in wells W2 has been carried out, in the same epitaxy reactor as that used in the previous etch step. A displacement of the support from one machine to the other, and thus any reoxidation or contamination of the support, are thus avoided. This enables eliminating a cleaning step before epitaxy, where such a step, for example in a hydrofluoric acid bath of low concentration, can modify the planar character of the sides of insulating walls 15. The epitaxial growth may be performed under a flow of silicon hydride, trichlorosilane $SiHCl_3$, or dichlorosilane $SiH_2Cl_2$, with or without added hydrochloric acid, at a temperature ranging between 700° C. and 900° C. The hydrochloric acid enables passivating the insulating walls so that the growth is only performed from the surface of silicon substrate 11. The silicon 19 formed during this epitaxy thus has an orientation (100). It can be acknowledged that, under the indicated conditions, a uniform growth from substrate 11 without forming facets on the upper surface of the epitaxial layer, which remains very planar, is obtained. This epitaxial growth is stopped when the upper surface of silicon 19 reaches the upper surface of insulating walls 15.

At the step illustrated in FIG. 2E, mask 17 located above wells W1 has been removed by selective etching over the material of insulating walls 15 and over silicon.

A support in which wells W1 have an orientation (110) and in which wells W2 have an orientation (100) is thus obtained, wells W1 and W2 directly having, with no etching, very planar upper surfaces located at the same level. Fast P-channel MOS transistors can thus be formed in wells W1 and fast N-channel MOS transistors can be formed in wells W2. The described method has the advantage of being relatively simple and of requiring but few steps. Further, the etching of the silicon present in wells W2 and the epitaxy of the silicon in these wells are performed in the same epitaxy reactor, which further simplifies the method by eliminating a support surface cleaning step between the two operations. Further, the etch and epitaxy steps are performed at low temperatures, which are easy to implement.

Specific embodiments of the present invention have been described. Various variations and modifications will occur to those skilled in the art. In particular, silicon substrate 11 has been defined as having an orientation (100) and silicon layer 13 has been defined as having an orientation (110). As a variation, the orientations of these two areas may be inverted, or be different from those described herein.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing silicon wells of two crystallographic orientations and having smooth upper surfaces, in a silicon support, comprising the successive steps of:

forming a silicon layer having a first crystallographic orientation on a silicon substrate having a second crystallographic orientation;

forming insulating walls which extend at least down to a border between the silicon substrate and the silicon layer, the insulating walls defining wells;

performing, in at least one well, a chemical vapor etch of the silicon layer by means of hydrochloric acid, in an epitaxy reactor, at a temperature ranging between 700° C. and 950° C.; and performing, in the at least one well, a vapor-phase epitaxy on the silicon substrate in the presence of a precursor of silicon and hydrochloric acid, at a temperature ranging between 700° C. and 900° C. and up to the upper surface of the silicon layer, this epitaxy being performed in said epitaxy reactor.

2. The method of claim 1, wherein the etch and epitaxy steps are carried out at a pressure ranging between 600 Pa and 11,000 Pa.

3. The method of claim 1, wherein the first crystallographic orientation has a (110) orientation and the second crystallographic orientation has a (100) orientation.

4. The method of claim 1, wherein the silicon precursor belongs to the group consisting essentially of trichlorosilane, dichlorosilane, and silicon hydrides.

5. The method of claim 1, wherein performing, in at least one well, a chemical vapor etch of the silicon layer by means of hydrochloric acid, in an epitaxy reactor, at a temperature ranging between 700° C. and 950° C. comprises performing in the at least one well, a chemical vapor etch of the silicon layer by means of hydrochloric acid, in the epitaxy reactor, at a temperature ranging between 700° C. and 900° C.

6. A method for manufacturing silicon wells of two crystallographic orientations and having smooth upper surfaces, in a silicon support, the method comprising:

forming a silicon layer having a first crystallographic orientation on a silicon substrate;

forming insulating walls which extend at least down to a border between the silicon substrate and the silicon layer, the insulating walls defining wells;

etching a portion of the silicon layer by means of hydrochloric acid, in an epitaxy reactor, at a temperature ranging between 700° C. and 950° C.; and performing, in at least one well, a vapor-phase epitaxy on the silicon substrate at a temperature ranging between 700° C. and 900° C., this epitaxy being performed in said epitaxy reactor.

7. A method for manufacturing silicon wells of two crystallographic orientations in a silicon support, the method comprising:

forming a silicon layer having a first crystallographic orientation on a silicon substrate;

forming insulating walls that extend at least down to a border between the silicon substrate and the silicon layer;

in an epitaxy reactor:

etching at least one well in the silicon layer; and epitaxially growing silicon in the at least one well such that an upper surface of a resulting epitaxy layer remains planar.

8. The method of claim 7, further comprising passivating insulating wall surfaces so that growth is only performed from a surface of the silicon substrate.

9. The method of claim 8, wherein passivating the insulating wall surfaces comprises flowing hydrochloric acid during epitaxy growth.

10. The method of claim 9, further comprising flowing one of Silicon hydride, trichlorosilane, and dichlorosilane during epitaxy growth.

11. The method of claim 10, wherein flowing one of silicon hydride, trichlorosilane and dichlorosilane comprises flowing silicon hydride, trichlorosilane and dichlorosilane at a temperature ranging between 700° C. and 900° C.

12. The method of claim 8, further comprising flowing one of silicon hydride, trichlorosilane, and dichlorosilane during epitaxy growth.

13. The method of claim 12, wherein flowing one of silicon hydride, trichlorosilane and dichlorosilane comprises flowing silicon hydride, trichlorosilane and dichlorosilane at a temperature ranging between 700° C. and 900° C.

14. The method of claim 7, wherein after epitaxy growth, a first well comprises silicon of the first crystallographic orientation and a second well comprises a second crystallographic orientation.

15. The method of claim 7, wherein etching comprises performing a chemical vapor etch using hydrochloric acid with hydrogen being used as a carrier gas.

16. The method of claim 15, wherein etching is performed at a temperature ranging between 700° C. and 950° C.

17. The method of claim 16, wherein etching is performed at a pressure ranging between 600 Pa and 11,000 Pa.

18. The method of claim 7, wherein etching comprises etching in a manner to avoid etching insulating walls to maintain a planar character of the walls.

* * * * *

UNITED STATES PATENT AND TRADEMARK OFFICE
CERTIFICATE OF CORRECTION

PATENT NO. : 7,776,679 B2
APPLICATION NO. : 12/175877
DATED : August 17, 2010
INVENTOR(S) : Nicolas Loubet et al.

It is certified that error appears in the above-identified patent and that said Letters Patent is hereby corrected as shown below:

On the title page, item (75) should read:
(75) Inventors: Nicolas Loubet, Domené, (FR); Didier Dutartre, Meylan (FR); Frederic Boeuf, Le Versoud (FR)

Claim 10, col. 6, line 2 should read:
of silicon hydride, trichlorosilane, and dichlorosilane during Signed and Sealed this Fifth Day of October, 2010

David J. Kappos
*Director of the United States Patent and Trademark Office*